(12) United States Patent
Yu et al.

(10) Patent No.: US 12,446,248 B2
(45) Date of Patent: Oct. 14, 2025

(54) TWO-DIMENSIONAL SEMICONDUCTOR TRANSISTOR WITH REDUCED HYSTERESIS AND METHOD OF MANUFACTURING THE SAME

(71) Applicant: KOREA UNIVERSITY RESEARCH AND BUSINESS FOUNDATION, Seoul (KR)

(72) Inventors: Hyun Yong Yu, Seoul (KR); Kyu Hyun Han, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 486 days.

(21) Appl. No.: 17/786,655

(22) PCT Filed: Jun. 17, 2020

(86) PCT No.: PCT/KR2020/007864
§ 371 (c)(1),
(2) Date: Jun. 17, 2022

(87) PCT Pub. No.: WO2021/206219
PCT Pub. Date: Oct. 14, 2021

(65) Prior Publication Data
US 2023/0013710 A1    Jan. 19, 2023

(30) Foreign Application Priority Data
Apr. 6, 2020 (KR) .................. 10-2020-0041544

(51) Int. Cl.
*H10D 30/47* (2025.01)
*H01L 21/02* (2006.01)
(Continued)

(52) U.S. Cl.
CPC ....... *H10D 30/47* (2025.01); *H01L 21/02568* (2013.01); *H01L 21/445* (2013.01);
(Continued)

(58) Field of Classification Search
CPC .............. H01L 29/24; H01L 29/66969; H01L 21/02568; H01L 21/445; H01L 21/7806; H10K 10/40; H10D 30/47
(Continued)

(56) References Cited

U.S. PATENT DOCUMENTS 9,496,138 B2    11/2016 Koyama et al.
2018/0190495 A1*    7/2018 Maehara .............. H01L 29/517
(Continued)

FOREIGN PATENT DOCUMENTS

KR    10-2011-0091516 A    8/2011
KR    10-2013-0047250 A    5/2013
(Continued)

OTHER PUBLICATIONS

Kim et al., Stretchable and Foldable Silicon Integrated Circuits, SCIENCE, vol. 320, 2008 (Year: 2008).*
(Continued)

*Primary Examiner* — Quoc D Hoang
(74) *Attorney, Agent, or Firm* — NSIP Law (57) ABSTRACT

A two-dimensional semiconductor transistor includes a gate electrode, a gate insulating layer disposed on the gate electrode, an organic dopant layer disposed on the gate insulating layer and comprising an organic material including electrons, a two-dimensional semiconductor layer disposed on the organic dopant layer, a source electrode disposed on the two-dimensional semiconductor layer, and a drain electrode disposed on the two-dimensional semiconductor layer and spaced apart from the source electrode. A hysteresis of the two-dimensional semiconductor transistor is reduced due to the two-dimensional semiconductor transistor including the organic dopant layer.

17 Claims, 6 Drawing Sheets

(51) Int. Cl.
*H01L 21/445* (2006.01)
*H01L 21/78* (2006.01)
*H10D 30/67* (2025.01)
*H10D 48/36* (2025.01)
*H10D 62/80* (2025.01)
*H10D 99/00* (2025.01)
*H10K 10/40* (2023.01)

(52) U.S. Cl.
CPC ..... *H01L 21/7806* (2013.01); *H10D 30/6739* (2025.01); *H10D 48/362* (2025.01); *H10D 62/80* (2025.01); *H10D 99/00* (2025.01); *H10K 10/40* (2023.02)

(58) Field of Classification Search
USPC .......................................................... 257/29
See application file for complete search history.

(56) References Cited

U.S. PATENT DOCUMENTS

| | | | |
|---|---|---|---|
| 2019/0036029 A1* | 1/2019 | Tamakuni | H01L 29/786 |
| 2019/0123149 A1* | 4/2019 | Lee | H10K 59/1213 |
| 2019/0139713 A1* | 5/2019 | Choi | H01L 21/2855 |

FOREIGN PATENT DOCUMENTS

| | | | |
|---|---|---|---|
| KR | 10-2016-0010690 A | 1/2016 | |
| KR | 10-1794714 B1 | 11/2017 | |
| KR | 10-2019-0045659 A | 5/2019 | |
| KR | 10-2023111 B1 | 11/2019 | |
| WO | WO-2016017871 A1 * | 2/2016 | ........... C07D 277/66 |

OTHER PUBLICATIONS

Lim, B., Baeg, K.-J., Jeong, H.-G., Jo, J., Kim, H., Park, J.-W., Noh, Y.-Y., Vak, D., Park, J.-H., Park, J.-W. and Kim, D.-Y. (2009), A New Poly(thienylenevinylene) Derivative with High Mobility and Oxidative Stability for Organic Thin-Film Transistors and Solar Cells. Adv. Mater., 21: 2808-2814 (Year: 2009).*

Björn Lüssem, Chang-Min Keum, Daniel Kasemann, Ben Naab, Zhenan Bao, and Karl Leo Chemical Reviews 2016 116 (22), 13714-13751 (Year: 2016).*

Robbiano et al., Polystyrene nanoparticle-templated hollow titania nanosphere monolayers as ordered scaffolds, 2018, Journal of Materials Chemistry, pp. 2502-2508 (Year: 2018).*

Neupane et al., 2D organic semiconductors, the future of green nanotechnology, Nano Materials Science, vol. 1, Issue 4, 2019, pp. 246-259 (Year: 2019) (Year: 2019).*

Park et al., A photolithographic method for fabricating electron devices based on MOCVD-grown MoS2, Chemical Engineering Journal, vol. 382, 2019 (Year: 2019) (Year: 2019).*

Jo, Seo-Hyeon, et al. "A High-Performance WSe2/h-BN Photodetector using a Triphenylphosphine (PPh3)-Based n-Doping Technique." *Advanced Materials* 28.24 (Apr. 23, 2016): pp. 4824-4831.

Hazut, Ori, et al. "Contact doping of silicon wafers and nanostructures with phosphine oxide monolayers." *ACS nano* 6.11 (Oct. 22, 2012): pp. 10311-10318.

* cited by examiner

TWO-DIMENSIONAL SEMICONDUCTOR TRANSISTOR WITH REDUCED HYSTERESIS AND METHOD OF MANUFACTURING THE SAME

CROSS REFERENCE TO RELATED APPLICATIONS

This application is a U.S. National Stage Application of International Application No. PCT/KR2020/007864, filed on Jun. 17, 2020, which claims the benefit under 35 USC 119 (a) and 365 (b) of Korean Patent Application No. 10-2020-0041544, filed on Apr. 6, 2020 in the Korean Intellectual Property Office, the entire disclosure of which is incorporated herein by reference for all purposes.

TECHNICAL FIELD

The present disclosure relates to a two-dimensional semiconductor transistor with reduced hysteresis and a method of manufacturing the same.

BACKGROUND ART

Recently, researches on an FET device based on a transition metal dichalcogenide, such as $MoS_2$, $WS_2$, $MoTe_2$, $MoSe_2$, $ReS_2$, $ReSe_2$, etc., which is a two-dimensional (2D) semiconductor material spotlighted as a new semiconductor material to replace silicon in the future, are being actively progressed.

The 2D semiconductor FET is attracting much attention as a future semiconductor device to replace the silicon due to its characteristics, such as low temperature process, simple manufacturing process, and high electron mobility, compared to the most common silicon (Si)-based MOSFET device.

However, the 2D semiconductor FET device based on silicon oxide ($SiO_2$) corresponding to a gate oxide formed by a thermal growth that has been most commonly used so far, has a large hysteresis.

DISCLOSURE

Technical Problem

The present disclosure provides a two-dimensional semiconductor transistor with reduced hysteresis.

The present disclosure provides a method of manufacturing the two-dimensional semiconductor transistor with reduced hysteresis.

Technical Solution

Embodiments of the inventive concept provide a two-dimensional semiconductor transistor including a gate electrode, a gate insulating layer disposed on the gate electrode, an organic dopant layer disposed on the gate insulating layer and including an organic material including electrons, a two-dimensional semiconductor layer disposed on the organic dopant layer, a source electrode disposed on the two-dimensional semiconductor layer, and a drain electrode disposed on the two-dimensional semiconductor layer and spaced apart from the source electrode.

The organic dopant layer includes at least one of triphosphine, diphenylphosphide, chlorodiphenylphosphine, and a conductive polymer.

The organic dopant layer is obtained by naturally oxidizing at least one of the triphosphine, the diphenylphosphide, the chlorodiphenylphosphine, and the conductive polymer.

The organic dopant layer includes at least one of tetrafluoro-tetracyanoquinonedimethane ($F_4TCNQ$), tetracyanoquinodimethane, nicotinamide adenine dinucleotide, phenyl-C61-butyric acid methyl ester, p-toluenesulfonic acid, dimethyl-4-phenylenediamine, tetrathiafulvalene, tetracyanoethylene (TCNE), 1,3,4,5,7,8-hexafluorotetracyano-naphthoquinodimethane ($F_6$-TCNNQ), perylene diimide, and trifluoroacetic acid (TFA).

The two-dimensional semiconductor layer includes a transition metal dichalcogenide.

The transition metal dichalcogenide includes at least one of molybdenum disulfide ($MoS_2$), rhenium disulfide ($ReS_2$), rhenium diselenide ($ReSe_2$), tungsten disulfide ($WS_2$), molybdenum ditelluride ($MoTe_2$), tungsten diselenide ($Wse_2$), graphite (BP), and molybdenum diselenide ($MoSe_2$).

The two-dimensional semiconductor layer includes at least one of silicon (Si), germanium (Ge), silicon germanium (SiGe), indium gallium zinc oxide (InGaZnO), tin oxide (SnO), a group 3-5 compound semiconductor, and a group 2-6 compound semiconductor.

The gate insulating layer includes at least one of silicon nitride (SiN), silicon dioxide ($SiO_2$), germanium dioxide ($GeO_2$), titanium dioxide ($TiO_2$), zinc oxide (ZnO), indium tin oxide (ITO), azo compound (AZO), magnesium oxide (MgO), aluminum oxide ($Al_2O_3$), zirconium dioxide ($ZrO_2$), zirconium silicate ($ZrSiO_4$), hafnium silicate ($HfSiO_4$), silicon nitride ($Si_3N_4$), strontium oxide (SrO), tantalum pentoxide ($Ta_2O_5$), yttrium oxide ($Y_2O_3$), hafnium oxide ($HfO_2$), lanthanum oxide ($La_2O_3$), and lanthanum aluminate ($LaAlO_3$).

The gate electrode is a portion of a silicon substrate doped with a p-type dopant.

The two-dimensional semiconductor transistor further includes a protective layer covering the organic dopant layer and a portion of an upper surface of the two-dimensional semiconductor layer.

Embodiments of the inventive concept provide a method of manufacturing a two-dimensional semiconductor transistor. The method includes forming a gate electrode, forming a gate insulating layer on the gate electrode, forming an organic dopant layer on the gate insulating layer, forming a two-dimensional semiconductor layer on the organic dopant layer, and forming a source electrode and a drain electrode on the two-dimensional semiconductor layer.

The forming of the organic dopant layer on the gate insulating layer includes mixing a solid organic dopant with a solvent to form a solution.

The solvent includes at least one of toluene, hexane, deionized water (DI) water, acetone, isopropyl alcohol (IPA), ethanol, methanol, anisole, or phosphate-buffered saline.

The organic dopant layer is formed by spin-coating a solution including an organic dopant on the gate insulating layer.

The method further includes baking the solution after the spin coating of the solution, and the baking of the solution is performed at a temperature from about 20° C. to about 180° C. for about 1 minute to about 10 minutes.

The organic dopant layer is formed by a drop casting method using a micropipette to drop an organic dopant solution onto a large-sized thin film.

The organic dopant layer is formed by a solution dipping method in which a thin film is dipped into a solution to attach an organic dopant to the thin film.

The forming of the two-dimensional semiconductor layer includes forming the two-dimensional semiconductor layer on a carrier substrate and disposing the carrier substrate on the gate insulating layer to stamp the carrier substrate.

The method further includes forming a protective layer on the organic dopant layer after the forming of the two-dimensional semiconductor layer.

The forming of the source electrode and the drain electrode includes forming a first photoresist layer on the two-dimensional semiconductor layer, patterning the first photoresist layer, forming a metal layer on the patterned first photoresist layer, and lifting off the first photoresist layer.

Advantageous Effects

According to the above, the hysteresis of the two-dimensional semiconductor transistor is reduced.

DESCRIPTION OF DRAWINGS

The above and other advantages of the present disclosure will become readily apparent by reference to the following detailed description when considered in conjunction with the accompanying drawings wherein.

DETAILED DESCRIPTION

Hereinafter, embodiments of the present disclosure will be described with reference to accompanying drawings. The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
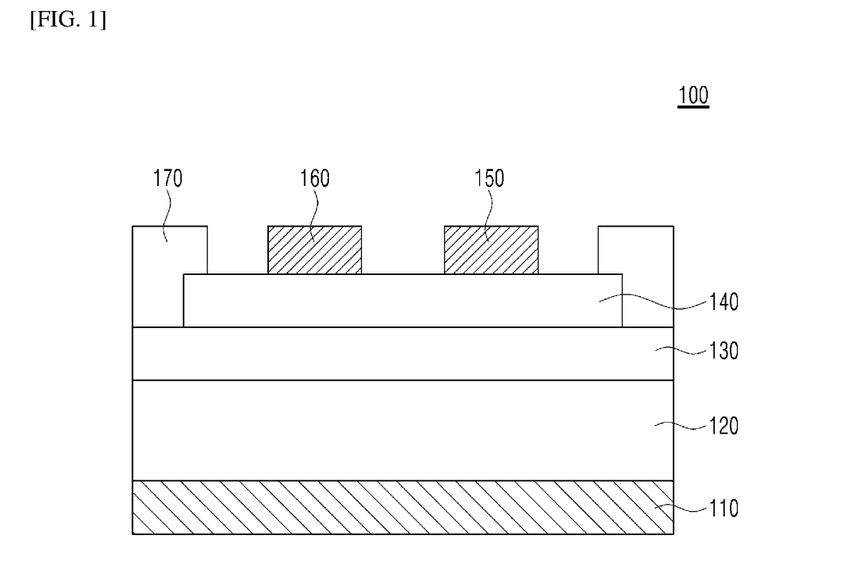
FIG. 1 is a cross-sectional view of a two-dimensional semiconductor transistor according to an embodiment of the present disclosure.

FIG. 1 is a cross-sectional view of a structure of a two-dimensional semiconductor transistor 100 according to an embodiment of the present disclosure.

Referring to FIG. 1, the two-dimensional semiconductor transistor 100 may include a gate electrode 110, a gate insulating layer 120, an organic dopant layer 130, a two-dimensional semiconductor layer 140, a source electrode 150, and a drain electrode 160.

According to an embodiment, the gate electrode 110 may include a conductive material. The gate electrode 110 may be, for example, a portion of a silicon substrate doped with a certain type of impurity. In the present embodiment, the impurity may be a P-type impurity. The gate electrode 110 may be formed using various methods. In the case where the gate electrode 110 is doped with the certain type of impurity, the gate electrode 110 may be formed at a relatively lower temperature than that of a conventional process.

According to an embodiment, the gate electrode 110 may be a metal layer containing a metal material. The metal material may include at least one of gold (Au), silver (Ag), platinum (Pt), chromium (Cr), titanium (Ti), copper (Cu), aluminum (Al), tantalum (Ta), molybdenum (Mo), tungsten (W), nickel (Ni) palladium (Pd), or an alloy thereof. As a metal oxide material, at least one of indium tin oxide (ITO), indium zinc oxide (IZO), indium tin zinc oxide (ITZO), Al-doped zinc oxide (AZO), and a gallium zinc oxide (GZO) may be used.

The gate insulating layer 120 may be disposed on the gate electrode 110. The gate insulating layer 120 may include at least one of an organic insulating material and an inorganic insulating material. In the case that gate insulating layer 120 includes the inorganic insulating material, the gate insulating layer 120 may have superior mechanical and chemical stability compared to those when the gate insulating layer 120 includes the organic insulating material.

According to an embodiment, the gate insulating layer 120 may include at least one selected from the group consisting of siloxane, silazane, and silicate which are capable of forming silicon oxide through a solution process.

In addition, the gate insulating layer 120 may include at least one of silicon nitride (SiN), silicon dioxide ($SiO_2$), germanium dioxide ($GeO_2$), titanium dioxide ($TiO_2$), zinc oxide (ZnO), indium tin oxide (ITO), azo compound (AZO), magnesium oxide (MgO), aluminum oxide ($Al_2O_3$), zirconium dioxide ($ZrO_2$), zirconium silicate ($ZrSiO_4$), hafnium silicate ($HfSiO_4$), silicon nitride ($Si_3N_4$), strontium oxide (SrO), tantalum pentoxide ($Ta_2O_5$), yttrium oxide ($Y_2O_3$), hafnium oxide ($HfO_2$), lanthanum oxide ($La_2O_3$), and lanthanum aluminate ($LaAlO_3$). The shape and the material of the gate insulating layer 120 should not be limited thereto or thereby and may be formed differently according to need.

The organic dopant layer 130 may include an organic dopant and may be disposed on the gate insulating layer 120. The organic dopant may be a material with a strong doping effect due to a direct charge transfer when in contact with a semiconductor.

As an example, the organic dopant layer 130 may include at least one of triphosphine, diphenylphosphide, chlorodiphenylphosphine, and a conductive polymer. The shape, number, or material of the organic dopant layer 130 should not be limited thereto or thereby and may be formed differently according to need.

In addition, the organic dopant layer 130 may include at least one of tetrafluoro-tetracyanoquinonedimethane ($F_4TCNQ$), tetracyanoquinodimethane, nicotinamide adenine dinucleotide, phenyl-C61-butyric acid methyl ester, p-toluenesulfonic acid, dimethyl-4-phenylenediamine, tetrathiafulvalene, tetracyanoethylene (TCNE), 1,3,4,5,7,8-hexafluorotetracyano-naphthoquinodimethane ($F_6$-TCNNQ), perylene diimide, and trifluoroacetic acid (TFA).

According to an embodiment, the organic dopant layer 130 may be formed by naturally oxidizing at least one of triphosphine, diphenylphosphide, chlorodiphenylphosphine, and a conductive polymer.

Figure 2:
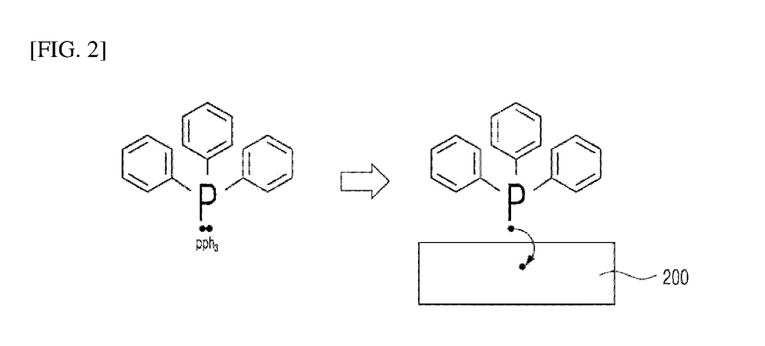
FIG. 2 is a view of triphosphine of an organic dopant according to an embodiment of the present disclosure.
Figure 3:
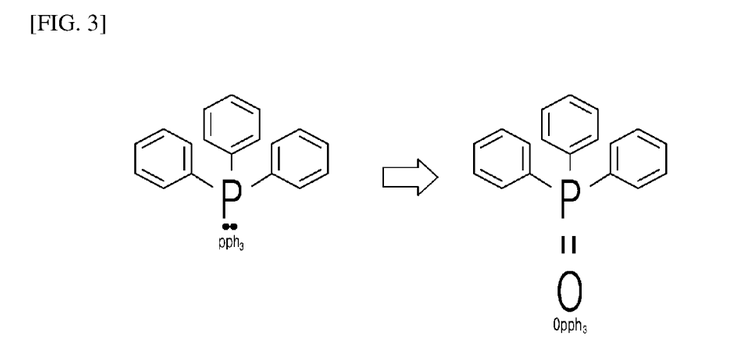
FIG. 3 is a view of a natural oxidation of triphosphine according to an embodiment of the present disclosure.

FIG. 2 is a view of triphosphine of the organic dopant according to an embodiment of the present disclosure and conceptually shows a direct transfer of electric charges to the semiconductor 200. FIG. 3 is a view of a natural oxidation reaction of triphosphine according to an embodiment of the present disclosure.

Referring to FIGS. 2 and 3, various organic dopants such as triphosphine may be oxidized naturally in air. These organic dopants may lose their properties as dopants by consuming electrons while being naturally oxidized. An organic dopant with an electron pair may be exposed to the air and may be bonded with an oxygen ($O_2$) molecule.

Figure 4:
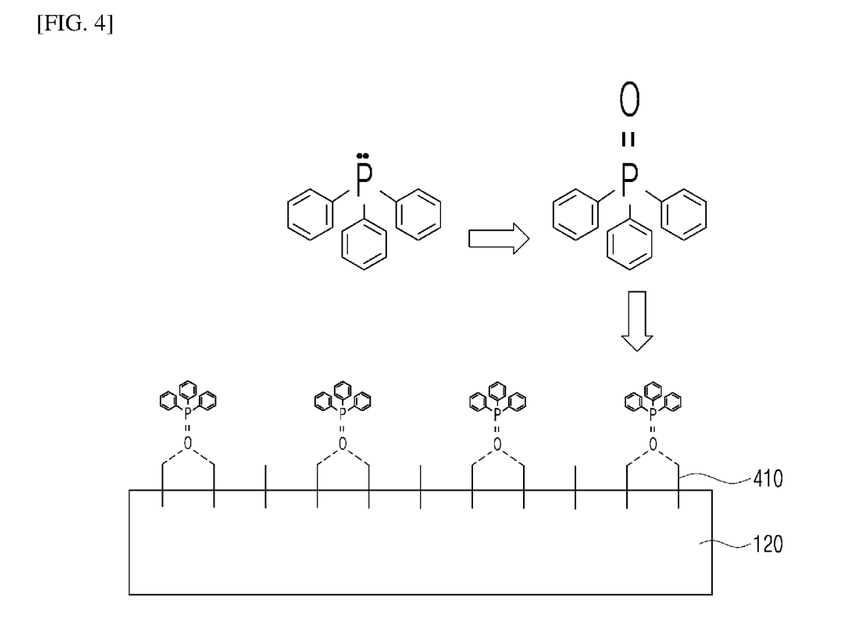
FIG. 4 is a view of a naturally oxidized organic dopant used as a passivation layer according to an embodiment of the present disclosure.

The organic dopant that is naturally oxidized may be used as a passivation layer. FIG. 4 shows the organic dopant naturally oxidized and used as the passivation layer according to the embodiment of the present disclosure.

Referring to FIG. 4, organic dopants each being provided with unshared electron pairs may be bonded with the oxygen while being naturally oxidized in the air, and the oxygen in the oxidized organic dopants may be hydrogen-bonded with an interfacial trap 410. When the oxidized organic dopants are hydrogen-bonded with the interfacial trap 410, the interfacial trap 410 of the gate insulating layer 120 may be reduced, and thus, a hysteresis may be reduced.

Referring to FIG. 1 again, the two-dimensional semiconductor layer 140 may be disposed on the organic dopant layer 130. The two-dimensional semiconductor layer 140 may be a transition metal dichalcogenide, and the transition metal dichalcogenide may include at least one of molybdenum disulfide ($MoS_2$), rhenium disulfide ($ReS_2$), rhenium diselenide ($ReSe_2$), tungsten disulfide ($WS_2$), molybdenum ditelluride ($MoTe_2$), tungsten diselenide ($WSe_2$), graphite (BP), and molybdenum diselenide ($MoSe_2$).

In addition, the two-dimensional semiconductor layer 140 may include at least one material of silicon (Si), germanium (Ge), silicon germanium (SiGe), indium gallium zinc oxide (InGaZnO), tin oxide (SnO), a group 3-5 compound semiconductor, and a group 2-6 compound semiconductor According to an embodiment, the two-dimensional semiconductor layer 140 may have a single-layer structure or a multi-layer structure.

According to an embodiment, a conductive type of the two-dimensional semiconductor layer 140 may be determined according to the type of the transition metal dichalcogenide of the two-dimensional semiconductor layer 140. As an example, the two-dimensional semiconductor layer 140 may include molybdenum disulfide ($MoS_2$), molybdenum diselenide ($MoSe_2$), zirconium disulfide ($ZrS_2$), zirconium diselenide ($ZrSe_2$), hafnium disulfide ($HfS_2$), hafnium diselenide ($HfSe_2$), tungsten disulfide ($WS_2$), rhenium disulfide ($ReS_2$), or rhenium diselenide ($ReSe_2$), and in this case, the conductive type of the two-dimensional semiconductor layer 140 may be an n-type.

According to an embodiment, the two-dimensional semiconductor layer 140 may include niobium diselenide ($NbSe_2$), tungsten diselenide ($WSe_2$), molybdenum ditelluride ($MoTe_2$), or graphite (BP), and in this case, the conductive type of the two-dimensional semiconductor layer 140 may be a p-type. The shape, number, and material of the two-dimensional semiconductor layer 140 should not be limited thereto or thereby and may be formed differently according to need.

The source electrode 150 and the drain electrode 160 may be disposed on the two-dimensional semiconductor layer 140. The source electrode 150 and the drain electrode 160 may be spaced apart from each other. The source electrode 150 and the drain electrode 160 may be formed of a conductive material. The conductive material may include a metal or metal oxide material.

As an example, at least one of gold (Au), silver (Ag), platinum (Pt), chromium (Cr), titanium (Ti), copper (Cu), aluminum (Al), tantalum (Ta), molybdenum (Mo), tungsten (W), nickel (Ni), palladium (Pd), or an alloy thereof may be used as the metal material. As the metal oxide material, at least one of indium tin oxide (ITO), indium zinc oxide (IZO), indium tin zinc oxide (ITZO), Al-doped zinc oxide (AZO), or a gallium zinc oxide (GZO) may be used. The shape, number, and material of the source electrode 150 and the drain electrode 160 should not be limited thereto or thereby and may be formed differently according to need.

Additionally, the two-dimensional semiconductor transistor 100 may further include a protective layer 170. The protective layer 170 may be provided to cover the organic dopant layer 130 and a portion of an upper surface of the two-dimensional semiconductor layer 140. The shape and material of the protective layer 170 should not be limited thereto or thereby and may be formed differently according to need.

The two-dimensional semiconductor transistor having the above-described structure may be manufactured by the following method.

Figure 5:
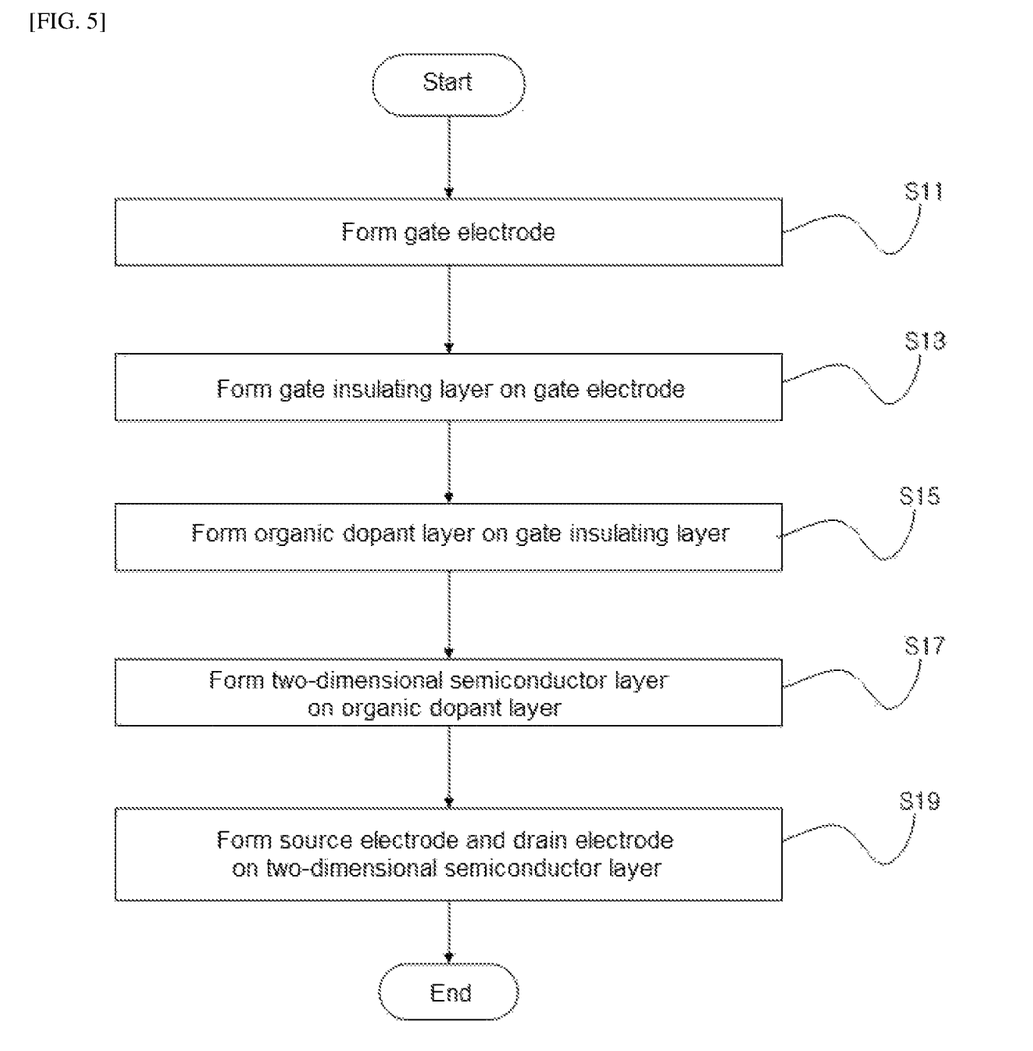
FIG. 5 is a flowchart of a method of manufacturing a two-dimensional semiconductor transistor according to an embodiment of the present disclosure.

FIG. 5 is a flowchart of a method of manufacturing the two-dimensional semiconductor transistor according to an embodiment of the present disclosure.

Referring to FIG. 5, the manufacturing method of the two-dimensional semiconductor transistor may include forming the gate electrode (S11), forming the gate insulating layer (S13), forming the organic dopant layer (S15), forming the two-dimensional semiconductor layer (S17), and forming the source electrode and the drain electrode (S19).

FIGS. 6A to 6E are cross-sectional views of the manufacturing method of the two-dimensional semiconductor transistor according to an embodiment of the present disclosure.

Figure 6A:
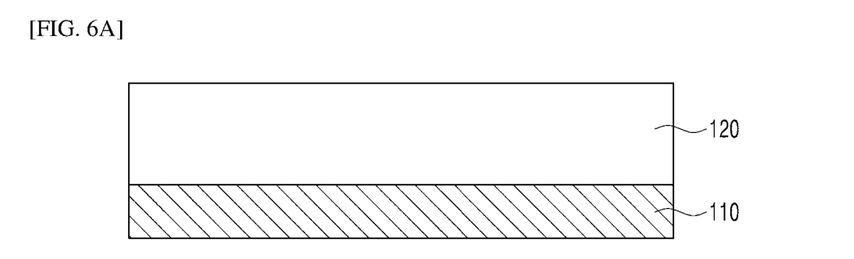
FIGS. 6A to 6E are cross-sectional views of a method of manufacturing a two-dimensional semiconductor transistor according to an embodiment of the present disclosure.

Referring to FIG. 6A, the gate electrode 110 may be formed, and then, the gate insulating layer 120 may be formed on the gate electrode 110.

The forming of the gate electrode 110 may be performed by doping a separate substrate (not shown), e.g., a silicon substrate, with a predetermined dopant or by forming a separate conductive layer, e.g., a metal layer or a metal oxide layer.

The gate insulating layer 120 may be formed by depositing or growing a material for the gate insulating layer 120 on the gate electrode 110.

Figure 6B:
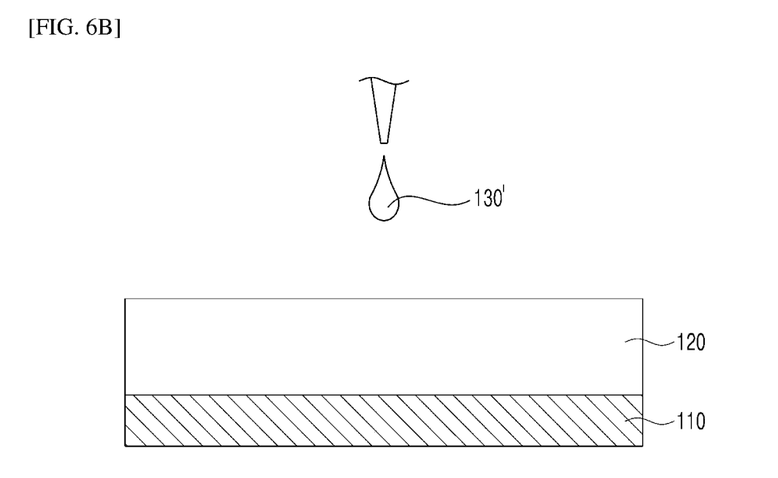

Referring to FIG. 6B, the organic dopant layer may be formed on the gate insulating layer 120. According to an embodiment, the organic dopant layer may be formed by a solution process in air, and FIG. 6B schematically shows a process of providing a solution 130' including the organic dopant in a liquid state on the gate insulating layer 120. When the solution 130' including the organic dopant is provided on the gate insulating layer 120, the solution 130' including the organic dopant may be baked, and thus, the organic dopant layer may be formed.

According to an embodiment, the solution process may be performed by one of a spin coating method, a slit coating method, a drop casting method, a dip casting method, an ink jet method, a printing method, and an imprint method. The shape and the material of the gate electrode 110 should not be limited thereto or thereby and may be formed differently according to need.

According to an embodiment, the forming of the organic dopant layer may include mixing the organic dopant with a solvent to prepare the organic dopant in the form of a solution. The solvent may include at least one of toluene, hexane, deionized water (DI) water, acetone, isopropyl alcohol (IPA), ethanol, methanol, anisole, or phosphate-buffered saline.

As an example, the organic dopant layer may be formed by spin coating the solution containing the organic dopant on the gate insulating layer 120. As another way, the organic dopant layer may be formed by the drop casting method using a micropipette to drop the organic dopant solution onto a large-sized thin film. In addition, the organic dopant layer may also be formed by a solution dipping method in which the thin film is dipped into the solution to attach the organic dopant to the thin film.

In the baking of the organic dopant layer, the organic dopant layer may be baked at a temperature from about 20° C. to about 180° C. for about 1 minute to about 10 minutes.

Figure 6C:
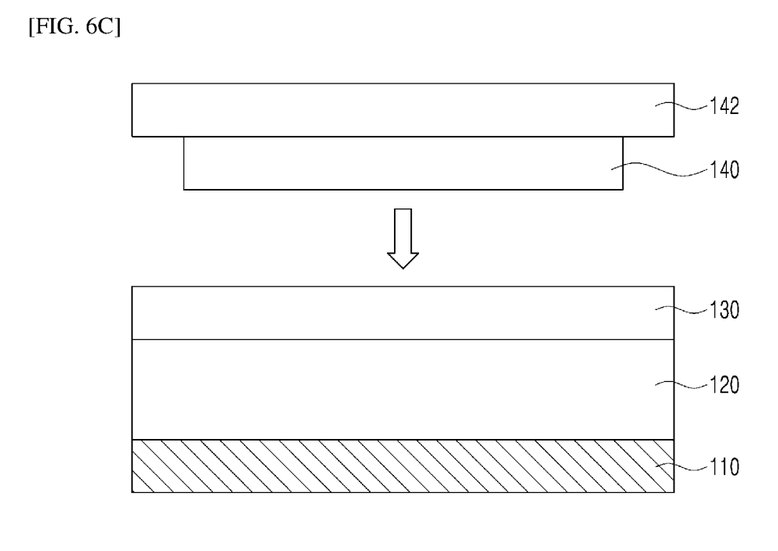

Referring to FIG. 6C, the two-dimensional semiconductor layer 140 may be formed on the organic dopant layer. According to an embodiment, the two-dimensional semiconductor layer 140 may be formed on an entire area of the organic dopant layer 130 and may be formed on a portion of the organic dopant layer 130.

According to an embodiment, the manufacturing method of the two-dimensional semiconductor layer 140 may include forming the two-dimensional semiconductor layer 140 on a carrier substrate 142 and stamping the two-dimensional semiconductor layer 140 formed on the carrier substrate 142 on the gate insulating layer 120.

The carrier substrate 142 may include a variety of materials, e.g., silicone in polydimethylsiloxane (PDMS). The two-dimensional semiconductor layer 140 may be formed on an entire area or a portion of carrier substrate 142.

The stamping of the carrier substrate 142 may include disposing the carrier substrate 142 on which the two-dimensional semiconductor layer 140 is formed on the gate insulating layer 120 and stamping the carrier substrate 142 such that the two-dimensional semiconductor layer 140 may be transferred to the gate insulating layer 120. A channel portion of the two-dimensional semiconductor layer 140 may be manufactured on the gate insulating layer 120 by the stamping process using the carrier substrate 142. According to an embodiment, the carrier substrate 142 may be patterned relative to a master to form a relief pattern used in a soft lithography.

Figure 6D:
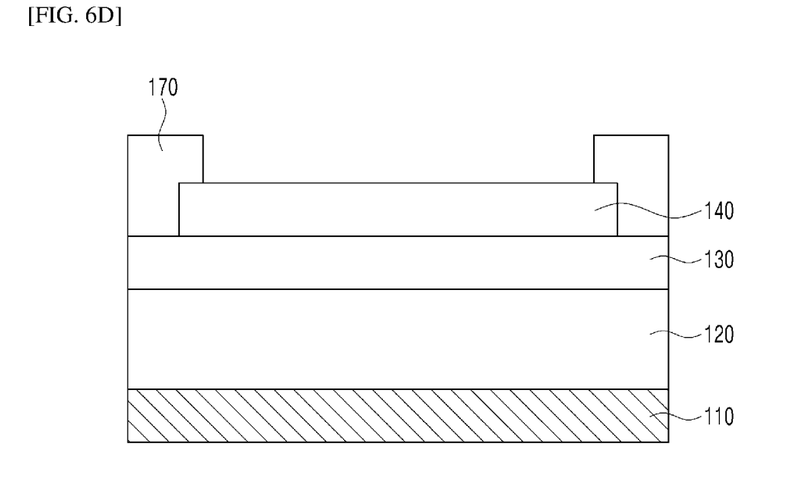

Referring to FIG. 6D, the protective layer 170 may be provided to cover the organic dopant layer 130 and the portion of the upper surface of the two-dimensional semiconductor layer 140. The channel portion of the two-dimensional semiconductor layer 140 may be formed by using a PDMS stamp, and separately, the protective layer 170 may be formed on the two-dimensional semiconductor layer 140.

As an example, the protective layer 170 may be formed by performing a patterning process of a positive photoresist on the PDMS stamp.

Figure 6E:
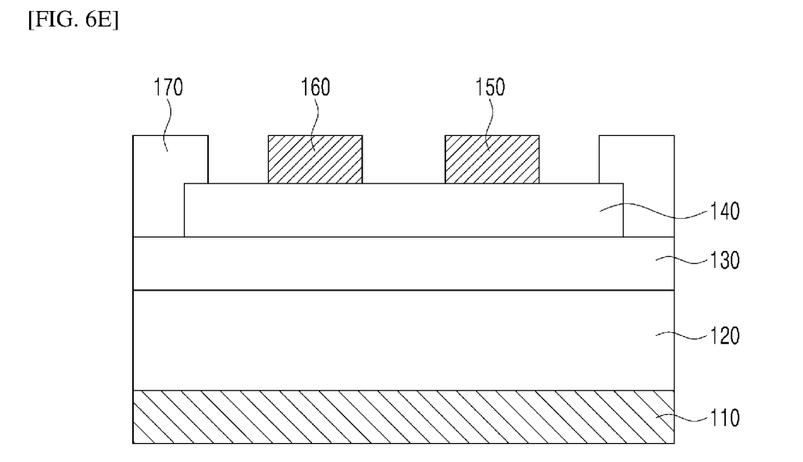

Referring to FIG. 6E, the source electrode 150 and the drain electrode 160 may be formed on the two-dimensional semiconductor layer 140. The source electrode 150 and the drain electrode 160 may be formed substantially simultaneously or may be formed separately from each other.

According to an embodiment, the forming of the source electrode 150 and the drain electrode 160 may include forming a first photoresist layer, patterning the first photoresist layer, forming a metal layer, and lifting off the first photoresist layer.

The first photoresist layer may be formed on the two-dimensional semiconductor layer 140 by the forming of the first photoresist layer. As an example, the first photoresist layer may be formed over an entire area of the two-dimensional semiconductor layer 140.

The first photoresist layer may be patterned by the patterning of the first photoresist layer. As an example, the first photoresist layer may be patterned as a negative photoresist.

The metal layer may be formed on the patterned first photoresist layer by the forming of the metal layer. As an example, the metal layer may be formed over an entire area of the first photoresist layer.

The first photoresist layer may be lifted off by the lifting off of the first photoresist layer. As an example, the first photoresist layer may be lifted off by spraying an etchant. When the first photoresist layer is lifted off, the source electrode 150 and the drain electrode 160 may be formed on a second semiconductor layer.

The two-dimensional semiconductor transistor having the above structure and manufactured by the above manufacturing method may be manufactured at a low temperature for a short time, and thus, may have the hysteresis smaller than that of the conventional semiconductor transistor. As an example, when the two-dimensional semiconductor transistor is manufactured with a naturally oxidized organic dopant at a low temperature of about 150° C. or less from a second to several seconds using a technology that passivates an SiO2 interfacial trap, the hysteresis may be reduced during the turn-on and turn-off operations of the two-dimensional semiconductor transistor while maintaining a high device durability and a film quality of SiO2.

Figure 7:
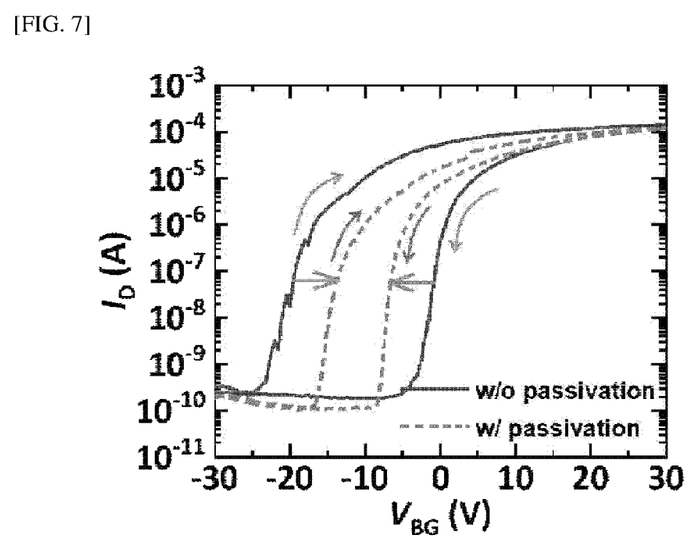
FIG. 7 is a graph of hysteresis of a conventional two-dimensional semiconductor transistor and a two-dimensional semiconductor transistor according to an embodiment of the present disclosure.

FIG. 7 is a graph of hysteresis of a conventional two-dimensional semiconductor transistor and a two-dimensional semiconductor transistor according to an embodiment of the present disclosure. The hysteresis of the conventional two-dimensional semiconductor transistor is indicated by a solid black line, and the hysteresis of the two-dimensional semiconductor transistor according to the present disclosure is indicated by a solid red line.

In FIG. 7, the two-dimensional semiconductor transistor according to the embodiment of the present disclosure is manufactured with the same structure and material as those of the conventional two-dimensional semiconductor transistor except the organic dopant layer. The organic dopant layer of the two-dimensional semiconductor transistor according to the embodiment of the present disclosure is manufactured by the following method. The organic dopant is manufactured as a solution at a concentration of about 5 w % by synthesizing about 0.5 g of naturally oxidized form of $pph_3$, and about 9.5 g of toluene. The prepared solution is used in a small amount of about 50 uL to form a film on a gate oxide film by a spin coating method for about 30 seconds. The baking process is performed on the film within a time from about 1 minute to about 10 minutes at a temperature from about 100° C. to about 150° C. to evaporate a toluene solvent.

Referring to FIG. 7, the hysteresis of the conventional two-dimensional semiconductor transistor to which no organic dopant layer is provided shows a very large value of $\Delta V_{TH}$ of about 20 V.

On the other hand, the hysteresis of the two-dimensional semiconductor transistor to which the organic dopant layer is provided according to the present disclosure shows a small value of about 10V or less, which is a remarkably small value. It seems that $\Delta V_{TH}$ ideally decreases as the naturally oxidized organic dopant suppresses an n-type doping effect occurring in the conventional two-dimensional semiconductor transistor. In addition, since a shift of the hysteresis in one direction, for example, in a negative direction, does not substantially occur, it is observed that the two-dimensional semiconductor transistor has substantially symmetrical switching characteristics during the turn-on and turn-off operations. Due to the switching characteristics, an additional power consumption is reduced when the two-dimensional semiconductor transistor according to the present disclosure is driven. In addition, the two-dimensional semiconductor transistor including the organic dopant layer according to the present disclosure requires the similar voltage for the turn-on operation and for the turn-off operation, and thus, the reduction in switching speed due to high power consumption and high sub-threshold swing may be reduced. In addition, it is possible to reduce a performance instability between devices due to a non-uniform distribution of the interfacial trap, which is the cause of large hysteresis.

The process for the two-dimensional semiconductor transistor performed at a low temperature for a short time according to the present disclosure is a low-level process, and an efficiency of manufacturing the two-dimensional semiconductor transistor with low thermal durability may increase.

Since silicon dioxide ($SiO_2$), which is the most frequently used material for the gate insulating layer, has advantages such as film quality, durability of the device against a gate voltage, and simplicity of the process, it is used more than any other material with less interfacial trap for the gate insulating layer. Accordingly, the two-dimensional semiconductor transistor according to the present disclosure may provide a high-efficiency process technology capable of improving the hysteresis through the low temperature and short time process while maintaining the material of the gate insulating layer as silicon dioxide ($SiO_2$).

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

The invention claimed is:

1. A two-dimensional semiconductor transistor comprising:
    a gate electrode;
    a gate insulating layer disposed on the gate electrode;
    an organic dopant layer disposed on the gate insulating layer and comprising an organic material comprising electrons;
    a two-dimensional semiconductor layer disposed on the organic dopant layer;
    a source electrode disposed on the two-dimensional semiconductor layer; and
    a drain electrode disposed on the two-dimensional semiconductor layer and spaced apart from the source electrode,
    wherein the organic dopant layer:
    comprises at least one of triphosphine, diphenylphosphide, and chlorodiphenylphosphine;
    is obtained by naturally oxidizing at least one of the triphosphine, the diphenylphosphide, and the chlorodiphenylphosphine; or
    comprises at least one of nicotinamide adenine dinucleotide, p-toluenesulfonic acid, dimethyl-4-phenylenediamine, tetracyanoethylene (TCNE), and trifluoroacetic acid (TFA).

2. The two-dimensional semiconductor transistor of claim 1, wherein the two-dimensional semiconductor layer comprises a transition metal dichalcogenide.

3. The two-dimensional semiconductor transistor of claim 2, wherein the transition metal dichalcogenide comprises at least one of molybdenum disulfide ($MoS_2$), rhenium disulfide ($ReS_2$), rhenium diselenide ($ReSe_2$), tungsten disulfide ($WS_2$), molybdenum ditelluride ($MoTe_2$), tungsten diselenide ($WSe_2$), graphite (BP), and molybdenum diselenide ($MoSe_2$).

4. The two-dimensional semiconductor transistor of claim 1, wherein the two-dimensional semiconductor layer comprises at least one of silicon (Si), germanium (Ge), silicon germanium (SiGe), indium gallium zinc oxide (InGaZnO), tin oxide (SnO), a group 3-5 compound semiconductor, and a group 2-6 compound semiconductor.

5. The two-dimensional semiconductor transistor of claim 1, wherein the gate insulating layer comprises at least one of silicon nitride (SIN), silicon dioxide ($SiO_2$), germanium dioxide ($GeO_2$), titanium dioxide ($TiO_2$), zinc oxide (ZnO), indium tin oxide (ITO), azo compound (AZO), magnesium oxide (MgO), aluminum oxide ($Al_2O_3$), zirconium dioxide ($ZrO_2$), zirconium silicate ($ZrSiO_4$), hafnium silicate ($HfSiO_4$), silicon nitride ($Si_3N_4$), strontium oxide (SrO), tantalum pentoxide ($Ta_2O_5$), yttrium oxide ($Y_2O_3$), hafnium oxide ($HfO_2$), lanthanum oxide ($La_2O_3$), and lanthanum aluminate ($LaAIO_3$).

6. The two-dimensional semiconductor transistor of claim 1, wherein the gate electrode is a portion of a silicon substrate doped with a p-type dopant.

7. The two-dimensional semiconductor transistor of claim 1, further comprising a protective layer covering the organic dopant layer and a portion of an upper surface of the two-dimensional semiconductor layer.

8. A method of manufacturing a two-dimensional semiconductor transistor, comprising:
    forming a gate electrode;
    forming a gate insulating layer on the gate electrode;
    forming an organic dopant layer on the gate insulating layer;
    forming a two-dimensional semiconductor layer on the organic dopant layer; and
    forming a source electrode and a drain electrode on the two-dimensional semiconductor layer,
    wherein the organic dopant layer:
    comprises at least one of triphosphine, diphenylphosphide, and chlorodiphenylphosphine;
    is obtained by naturally oxidizing at least one of the triphosphine, the diphenylphosphide, and the chlorodiphenylphosphine; or comprises at least one of nicotinamide adenine dinucleotide, p-toluenesulfonic acid, dimethyl-4-phenylenediamine, tetracyanoethylene (TCNE), and trifluoroacetic acid (TFA), tetrathiafulvalene.

9. The method of claim 8, wherein the forming of the organic dopant layer on the gate insulating layer comprises mixing a solid organic dopant with a solvent to form a solution.

10. The method of claim 9, wherein the solvent comprises at least one of toluene, hexane, deionized water (DI) water, acetone, isopropyl alcohol (IPA), ethanol, methanol, anisole, or phosphate-buffered saline.

11. The method of claim 8, wherein the organic dopant layer is formed by spin-coating a solution comprising an organic dopant on the gate insulating layer.

12. The method of claim 11, further comprising baking the solution after the spin coating of the solution, wherein the baking of the solution is performed at a temperature from about 20° C. to about 180° C. for about 1 minute to about 10 minutes.

13. The method of claim 8, wherein the organic dopant layer is formed by a drop casting method using a micropipette to drop an organic dopant solution onto a large-sized thin film.

14. The method of claim 8, wherein the organic dopant layer is formed by a solution dipping method in which a thin film is dipped into a solution to attach an organic dopant to the thin film.

15. The method of claim 8, wherein the forming of the two-dimensional semiconductor layer comprises:
   forming the two-dimensional semiconductor layer on a carrier substrate; and
   disposing the carrier substrate on the gate insulating layer to stamp the carrier substrate.

16. The method of claim 8, further comprising forming a protective layer on the organic dopant layer after the forming of the two-dimensional semiconductor layer.

17. The method of claim 8, wherein the forming of the source electrode and the drain electrode comprises:
   forming a first photoresist layer on the two-dimensional semiconductor layer;
   patterning the first photoresist layer;
   forming a metal layer on the patterned first photoresist layer; and
   lifting off the first photoresist layer.

* * * * *